Sept. 10, 1968 L. A. D'ASARO 3,401,357

ELECTROMAGNETIC WAVE AMPLIFIER OSCILLATOR AND MODULATOR

Filed Aug. 11, 1965 4 Sheets-Sheet 1

INVENTOR
L. A. D'ASARO
BY Sylvan Sherman
ATTORNEY

ELECTROMAGNETIC WAVE AMPLIFIER OSCILLATOR AND MODULATOR 3,401,357
Patented Sept. 10, 1968

3,401,357

ELECTROMAGNETIC WAVE AMPLIFIER OSCILLATOR AND MODULATOR

Lucian A. D'Asaro, Madison, N.J., assignor to Bell Telephone Laboratories, Incorporated, New York, N.Y., a corporation of New York Filed Aug. 11, 1965, Ser. No. 478,912
8 Claims. (Cl. 332—7.51)

This invention relates to solid-state amplifiers and oscillators using optical wave modulation and demodulation techniques.

The invention of the laser, which generates highly collimated optical waves, has stimulated interest in the use of optical waves for communication purposes. However, in order to make full use of such optical waves for this purpose, it has been necessary to develop new circuit components such as optical wave modulators and optical wave demodulators.

Concurrently, though independently of the work in the optical field, efforts to replace the vacuum tube in high frequency oscillators with solid-state components have been under way. The object of this latter work is to materially reduce the size and power requirements of high frequency oscillators and amplifiers, and to reduce the maintenance problems by using circuit components which have longer lifetimes and are more rugged. However, the design of solid-state amplifiers operative at very high frequencies has posed a number of very different problems which have defied easy solutions.

The present invention represents a radical approach to the problem and achieves the desired amplification indirectly as a byproduct of efficient modulation and demodulation processes. In particular, the present invention involves impressing the signal to be amplified as modulation on an optical carrier wave, and immediately thereafter recovering the signal at an amplified level by demodulation of the modulated carrier, advantageously, without the intervention of a discrete amplifier. Such amplification is made possible by appropriate control of the modulation and demodulation processes. Moreover, appropriate modulation and demodulation can be realized with solid-state devices.

To obtain an oscillator, a feedback circuit is provided between the output of the demodulator and the modulation input to the modulator.

In one illustrative embodiment of the invention, to be described in greater detail hereinbelow, modulation is produced in an electro-optical junction modulator. The light directed upon the modulator is polarized with its electric vector at 45 degrees to the junction plane. After passing through the modulator, the light, whose polarization is converted to elliptical polarization during the modulation process, is passed through an analyzer whose direction of polarization is perpendicular to the direction of polarization of the light incident upon the modulator.

The modulated light passed by the analyzer is demodulated and an amplified replica of the modulating signal recovered. In the oscillator embodiment, a portion of the signal recovered in the demodulation process is coupled back to the modulator by means of a feedback circuit.

Demodulation can be effected in a simple photodiode, or an avalanche multiplication photodetector can be used to obtain a further increase in gain.

It is an advantage of the invention that amplification and oscillations can be obtained in a circuit using only solid-state elements if so desired.

These and other objects and advantages, the nature of the present invention, and its various features, will appear more fully upon consideration of the various illustrative embodiments now to be described in detail in connection with the accompanying drawings, in which.

Figure 1:
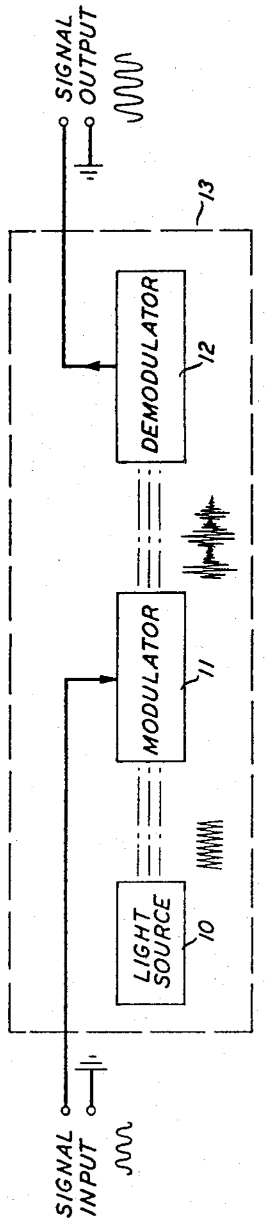
FIG. 1 shows, in block diagram, an amplifier in accordance with the present invention.

Referring to the drawings, FIG. 1 shows, in block diagram, the essentials of an amplifier in accordance with the present invention. The amplifier includes, in close juxtaposition, a light source 10, a light modulator 11 and a light demodulator 12, all contained within a common enclosure 13. Means are provided for coupling the signal to be amplified to the modulaor, and means are provided for coupling the amplified signal out of the demodulator.

In operation a light beam derived from source 10 impinges upon modulator 11 where it is amplitude modulated by the input signal. The modulated light beam is then demodulated in demodulator 12, and an amplified replica of input signal is recovered.

To convert the amplifier of FIG. 1 into an oscillator, a feedback circuit is added whereby a portion of the output signal is fed back to the modulator. This is illustrated in FIG. 2 which shows, in block diagram, an oscillator in accordance with the present invention.

Figure 2:
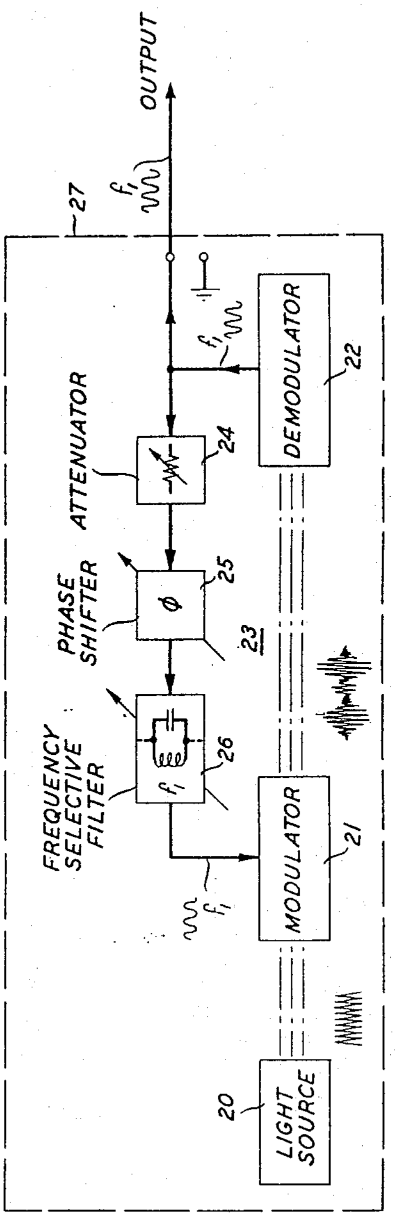
FIG. 2 shows, in block diagram, an oscillator in accordance with the present invention.

Referring to FIG. 2, the oscillator includes a light source 20, a light modulator 21, a light demodulator 22, and a feedback circuit 23 which couples a portion of the output signal back to the modulator. As with the amplifier, all the component parts of the oscillator are in close proximity to each other and typically contained within a common enclosure 27. The feedback circuit typically includes an adjustable attenuator 24, an adjustable phase shifter 25, and may also include a frequency selective circuit, or filter 26, for passing a narrow band of signals centered at a preselected frequency designated $f_1$. Alternatively, the frequency selective circuit can be associated with either the modulator or the demodulator or both.

While in some respects the arrangement of light source, modulator and demodulator is reminiscent of the arrangement of these components in an optical communications system, there are nevertheless essential differences between their use in a communications system and their use as an amplifier and oscillator in accordance with the present invention. The most obvious difference is that when used as an amplifier or oscillator, the components are physically present at the same location in a proximate relation and would typically be included within the same encosure in close juxtaposition to each other. In a communications system, on the other hand, the light source and modulator comprise the transmitter station whereas the demodulator is typically at the receiving station located at some distance, measured in miles, from the transmitting station.

Secondly, in order to realize gain at the signal frequency, it is necessary that the product of the modulator efficiency and the demodulator efficiency be greater than one, where modulator efficiency is defined as the ratio of the light power which has been modulated to the signal power dissipated in the modulator, and the demodulator efficiency is defined as the ratio of the signal power output to the modulated light power input.

In a typical communications system, on the other hand, there is no particular requirement imposed upon these efficiencies as gain is separately obtained in discrete amplification processes to whatever extent necessary.

In addition, when used as an oscillator, the presence of a feedback path from the output of the demodulator to the input of the modulator is a further distinguishing feature of one aspect of the present invention.

The operation of the oscillator of FIG. 2 is similar to the operation of the amplifier of FIG. 1 in that a light beam derived from source 20 impinges upon modulator 21 where it is amplitude modulated by the modulating signal $f_1$ supplied through feedback circuit 23. The modulated light beam is then demodulated in demodulator 22. The signal derived by the demodulation process constitutes the output signal. In the oscillator embodiment, however, a portion of this signal is also fed back through feedback circuit 23 to modulator 21. Oscillations occur when the feedback signal satisfies the well-known phase and amplitude requirements for oscillations.

Figure 3:
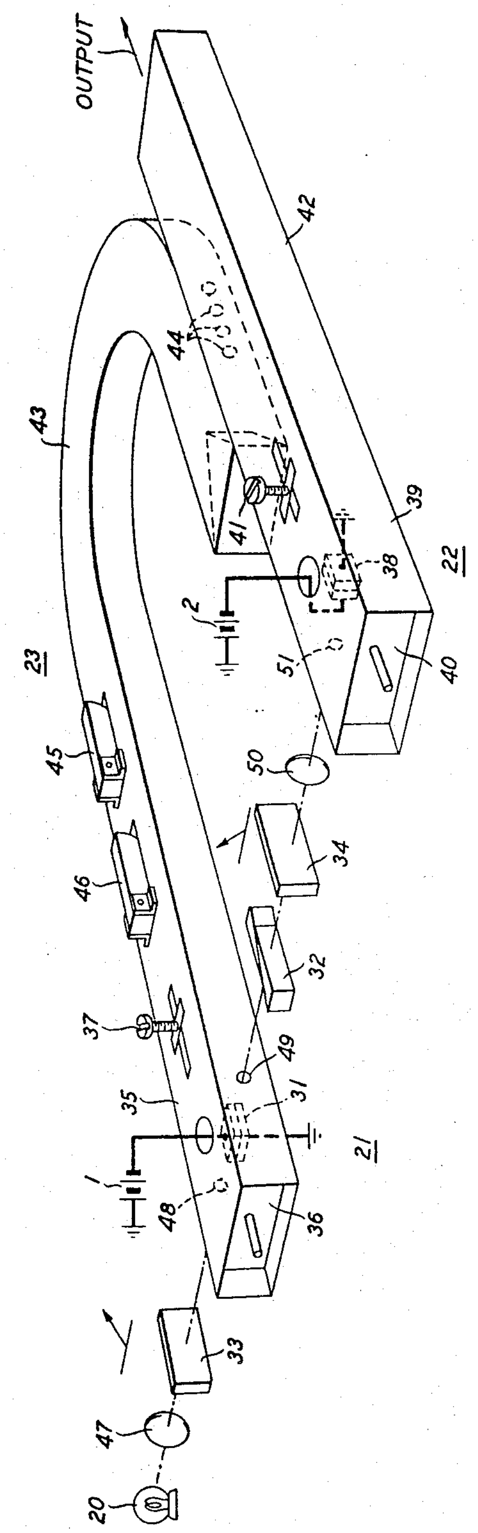
FIG. 3 is an illustrative embodiment of the invention using rectangular waveguide as the transmission medium and using p-n junction diodes as the modulator and demodulator.

FIG. 3 is an illustrative embodiment of an oscillator in accordance with the invention using rectangular waveguide as the transmission medium. Where possible the same identification numerals that were used in FIG. 2 are used in FIG. 3 in order to facilitate the identification of the various component parts. Thus, in FIG. 3, the light source 20 of FIG. 2 is illustrated simply as a lamp 20, since there is no requirement that the light be either monochromatic or coherent. However, it is advantageous that the light have a high intensity and be capable of being focused onto a small area. For these reasons it may be preferable, in some situations, that the light source be any suitable one of the many types of lasers known in the art. In an all solid-state oscillator, the light source can be a junction diode laser or simply an electroluminescent diode.

Modulator 21, which comprises a p-n junction diode 31 and a compensator 32 located between a pair of crossed polarizers 33 and 34, utilizes the large birefrigent effect that has been observed in the depletion layers of reversed biased p-n junctions. The modulator operates in the manner described by D. F. Nelson and F. K. Reinhart in their article entitled, "Light Modulation by the Electro-Optical Effect in Reversed-Biased GaP P-N Junctions," Applied Physics Letters, vol. 5, No. 7, October 1, 1964, p. 148.

Diode 31 is located within a waveguide cavity 35 defined by the adjustable shorting piston 36 and the slide-screw tuner 37. Cavity 35 is tuned to the oscillator output frequency by means of piston 36 and tuner 37.

Demodulator 22 similarly comprises a p-n junction diode 38 located in a cavity 39 defined by an adjustable shorting piston 40 and a slide-screw tuner 41.

Direct current biasing sources 1 and 2 are provided to bias diodes 31 and 38, respectively.

Advantageously, diode 38 is a silicon p-n junction photodiode of the type described by L. K. Anderson, P. G. McMullin, L. A. D'Asaro and A. Goetzberger in their article entitled "Microwave Photo Diodes Exhibiting Microplasma-Free Carrier Multiplication," published in the Applied Physics Letters of 15 February 1965, vol. 6, No. 4, page 62. As was noted in this article such diodes utilize the mechanism of avalanche multiplication and are capable of producing current gain at microwave frequencies.

Cavity 39 is also tuned to the oscillator output frequency by means of piston 40 and tuner 41.

The modulating signal derived from the demodulation process is coupled out of the oscillator by way of a section of rectangular waveguide 42. A portion of the output signal is coupled back to modulator 21 through feedback path 23 which includes a second section of waveguide 43. The amount of wave energy coupled back is determined by the directional coupler defined by the plurality of apertures 44 longitudinally distributed along the common wall between waveguides 42 and 43. (For a discussion of the design of directional couplers see "Multi-Element Directional Couplers," by S. E. Miller and W. W. Mumford, Proceedings of the Institute of Radio Engineers, vol. 40, September 1952, pages 1071–1078.)

Feedback path 23 also includes an adjustable phase shifter and an adjustable attenuator. Each of these components may take the form of any one of the many well-known phase shifters and attenuators. In FIG. 3 both are illustrated as adjustable vane-type components. Thus, the adjustable phase shifter comprises a low-loss dielectric vane 45 and the adjustable attenuator comprises a lossy vane 46. (See U.S. Patent 2,731,603 for a description of vane attenuators.) Both extend into waveguide 43 through slots in the upper wide wall of the waveguide. By varying the extent to which the vanes are inserted into waveguide 43, the amount of phase shift and the amount of attenuation are controlled.

In operation, light from lamp 20 is focused upon the junction region of p-n junction diode 31 by means of a lens 47. The light is polarized along a direction at 45 degrees to the plane of the junction by means of polarizer 33, and passes into cavity 35 through a hole 48 in one of the narrow cavity walls. The linearly polarized light is converted to elliptically polarized light by the action of the microwave energy upon diode 31. In particular, the degree of ellipticity of the polarization of the light emerging from the depletion region of diode 31 varies as the instantaneous amplitude of the microwave electric field applied across diode 31.

The emerging light leaves cavity 35 through a second hole 49 in the opposite narrow cavity wall, and passes through compensator 32 and through the second polarizer, or analyzer, 34, which only passes those components of light which are polarized along the direction of polarization of the second polarizer.

The output from modulator 31 is an amplitude modulated light beam whose intensity varies in accordance with the instantaneous variations of the microwave field within cavity 35. This amplitude modulated light wave is focused upon photodiode 38 through a hole 51 in the adjacent narrow wall of cavity 39 by means of a second lens 50. The modulated light is demodulated by the action of photodiode 38 and the recovered high frequency energy is coupled to the resonantly tuned cavity 39, and out of cavity 39 to the output terminal of waveguide 42. The major portion of this signal constitutes the oscillator output signal. A small portion of it is coupled through apertures 44 to waveguide 43 and back to the modulator cavity 35. By adjusting the phase and amplitude of the energy fed back by means of vanes 45 and 46, the well-known conditions for oscillations are established in the system.

As was noted in the discussion hereinabove, in order to obtain amplification (and oscillations) it is necessary that the product of the modulator efficiency and the demodulator efficiency be greater than one. Preferably, however, both the modulator and the demodulator would have an efficiency greater than one. To achieve this level of performance in a modulator, the latter is advantageously made of a material that has a high electro-optical coefficient. That is, the material of which the modulator is made is chosen such that the differential phase shift along the direction of polarization parallel to the modulating electric field and along the direction of polarization perpendicular to the electric field is as large as possible per unit of electric field. Secondly, the modulator is highly transparent at the wavelength of the light. While this would appear to be a rather obvious condition, the concurrent requirement that the demodulator also operate efficiently at this wavelength may require that a compromise be made in this regard. Finally, in order to minimize the amount of modulating power that is dissipated in the modulator, the series resistance of the modulator is advantageously made as small as possible. One way of realizing this latter feature is to utilize the epitaxial construction technique in the manufacture of a $p^+nn^+$ modulator diode.

One illustration of a modulator having some of the preferred characteristics described above is the gallium phosphide p-n junction modulator described by Nelson and Reinhart in their above-cited article. They report for an experimental diffused junction GaP modulator, an electro-optical modulation coefficient $K=1.31$ rad/volt cm. at $\lambda=5460$ A., and an index of refraction of 3.45 for a donor concentration of $N_d \cong 1\times10^{17}$ cm.$^{-3}$. For a modulating voltage $V_m$ of 30 volts, the specific capacitance $C_{ms}$ was $3.1\times10^7$ pf./cm.$^2$, or 3.1 pf. for a crystal of length $L=10^{-1}$ cm. and width $W=10^{-3}$ cm. The power gain-bandwidth product $G_p{}^{1/2}f$ for such a modulator is 370 kc./sec. for an incident optical power of $10^{-3}$ watts. Inasmuch as the gain increases linearly with the power of the incident optical beam, a power gain-bandwidth of 370 mc./sec. can be realized for one watt of applied optical power.

Similar calculations can be made for a $p^+nn^+$ gallium arsenide diode made by the diffusion of acceptors into an n-type epitaxial region on an $n^+$ substrate. The thickness of the n-region is arranged so that the space charge penetrates through the lightly doped region into the interface. Such structures yield RC products corresponding to bandwidths of several hundred gigacycles per second.

A preferred doping level is one for which the light containment width (the distance between planes where the light intensity near the junction falls to $1/e$ of its peak value) is equal to the space charge width. This produces maximum interaction of the light with the modulating electric field.

At the wavelength of $\lambda=9500$ A., the refractive index is 3.54, and the electro-optical modulation coefficient K is 2.70 rad/volt cm. The power gain-bandwidth at $10^{-3}$ watts input is 2.3 mc./sec. At one watt the power gain-bandwidth is 2.3 gc./sec.

The electro-optical effect in a Schottky barrier diode made of semiconducting n-type potassium tantalate can also be utilized as a modulator. At 9500 A., the electro-optical modulation coefficient K is 22.4 rad/volt cm., the refractive index is 2.21, and the gain-bandwidth is 6.1 mc./sec. at $10^{-3}$ watts and 6.1 gc./sec. at one watt of applied optical power.

Figure 4:
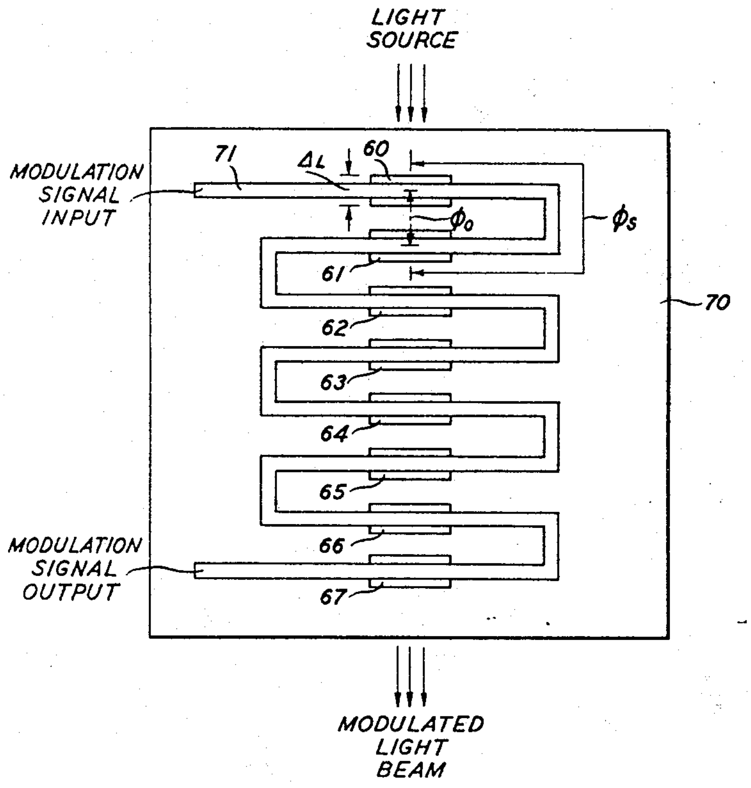
FIG. 4 shows the top view of a traveling wave optical modulator useful in the invention.

If the length of the modulator could be increased, a larger gain-bandwidth could be realized. However, as the length of the modulator is increased, transit time difficulties are encountered. To avoid these difficulties and still realize the added gain-bandwidth associated with a modulator of increased length, the traveling wave modulator illustrated in FIG. 4 is used.

In this arrangement, a plurality of junction regions 60 through 67 of incremental length $\Delta L$ are formed on a semiconductor substrate 70. Typically, this can be done by a masked diffusion process. A TEM mode strip transmission line for the modulating signal is formed by evaporating a folded metal strip 71 over the junction regions. The metallic strip is insulated from substrate 70 by means of an insulating layer such as silicon dioxide.

The dimensions of the waveguiding transmission line are selected such that the velocity of propagation of the modulating signal in the direction of the light beam is equal to the velocity of propagation of the light beam. Put another way, the dimensions are selected such that the net phase shift $\varphi_o$ of the light between adjacent junction regions is equal to the net phase shift $\varphi_s$ of the modulating signal between adjacent junction regions.

The number of junction regions is limited by the size of the crystal substrate 70 and the attenuation of the light. Practical lengths result in transit time cutoffs higher than 100 gc./sec. in the light beam.

Figure 5:
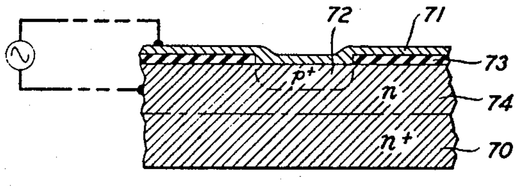
FIG. 5 is a cross-sectional view of the modulator of FIG. 4.

FIG. 5 is a cross-sectional view of one of the junction regions showing an $n^+$ substrate 70, an epitaxial layer 74 and a $p^+$-region 72. The metal strip 71 is insulated from the epitaxial layer 74 by an insulating layer 73.

The modulating signal is applied between the metallic strip 71 and the epitaxial layer 74.

Gain in the demodulator can be readily obtained by using a photomultiplier type detector. One such detector, capable of gain at microwave frequencies, is described in the above-cited paper by L. K. Anderson et al. Typically, a conservative current multiplication factor of at least four can readily be obtained. The invention, however, is not limited to any particular type of detector. In general, the only limitation imposed upon the modulator and detector is that together they are capable of producing a net gain at the modulating frequency.

Figures 6, 7:
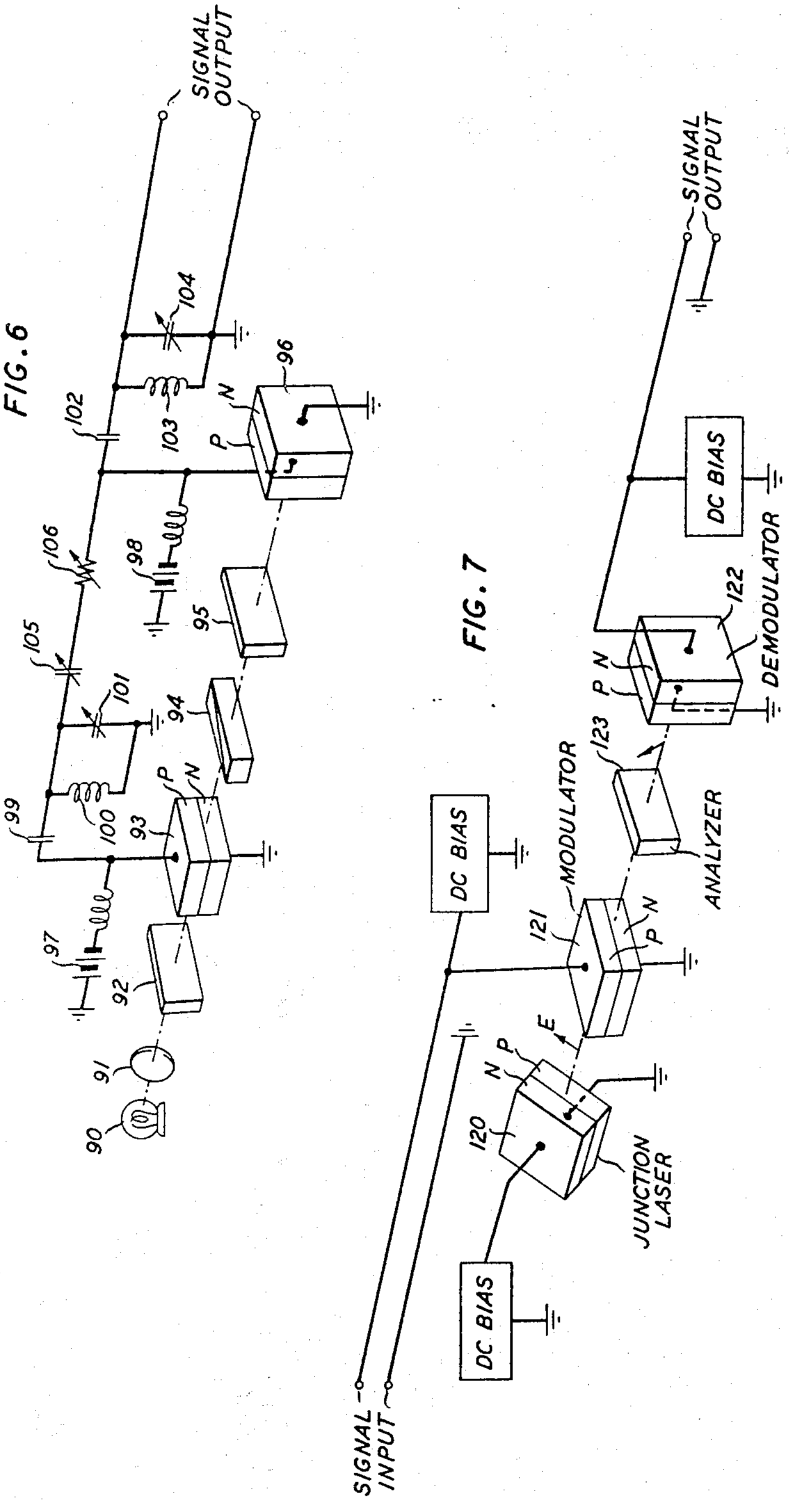
FIG. 6 is an oscillator in accordance with a form of the invention, using lumped circuit components.
FIG. 7 is an illustrative embodiment of an amplifier using three diodes and an analyzer.

While characterized as a high frequency oscillator, it is understood that the present invention is not limited to any particular modulating frequency. For example, FIG. 6 is illustrative of a low frequency oscillator using lumped circuit components such as conventional wire-wound coils and parallel-plate capacitors. The oscillator is basically the same as that illustrated in FIG. 3 and includes a light source 90, a focusing lens 91, a polarizer 92, a semiconductor diode modulator 93, a compensator 94, an analyzer 95, and a semiconductor diode demodulator 96. Direct current power sources 97 and 98 are provided for biasing modulator 93 and demodulator 96, respectively.

Modulator 93 is connected through blocking capacitor 99 to a tuned circuit comprising inductor 100 and tuning capacitor 101. Similarly, demodulator 96 is connected through a blocking capacitor 102 to a tuned circuit comprising inductor 103 and tuning capacitor 104.

A feedback circuit comprising an adjustable series capacitor 105 and an adjustable series resistor 106 couples a portion of the power from the demodulator tuned circuit to the modulator circuit. The oscillator output is taken across the demodulator tuned circuit.

In operation, the oscillator of FIG. 6 is in all essential respects the same as the operation of the embodiment of FIG. 3.

One of the advantages of an amplifier or oscillator in accordance with the present invention is that it can be implemented using solid-state components exclusively and, as such, requires very little power and can be made exceedingly small. These features of the invention are illustrated in the amplifier shown in FIG. 7 which comprises three junction diodes and an analyzer. The first of these diodes is an injection laser 120 which provides a polarized light beam. By orienting the diode 120, the direction of polarization of the emitted light can be oriented in any desired manner. Thus, in FIG. 7 the junction plane of diode 120 is oriented at 45 degrees to the junction plane of the second junction diode 121, which functions as the modulator. The output from modulator diode 121 is directed upon photodiode 122 through analyzer 123. Diode 122 functions as the demodulator.

Suitable direct current biasing sources are provided for each of the diodes in the manner well known in the art.

When it is realized that each of the diodes illustrated in FIG. 7 have physical dimensions which are in the order of millimeters, it is readily recognized that amplifiers and oscillators whose overall dimensions are of the order of less than a centimeter can easily be constructed.

While the illustrative embodiments of FIGS. 3 and 6 are oscillators, it is recognized that by omitting the feedback circuits, a similar arrangement of components can be used as a signal amplifier. Similarly, by the addition of a feedback circuit, the amplifier of FIG. 7 can be made into an oscillator. It is also understood that the invention is not limited to the particular modulators and demodulators described hereinabove, but that the combination of any type of optical modulator and demodulator capable of producing a net gain at the modulating frequency can be used. Thus, in all cases it is understood that the above-described arrangements are illustrative of a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. An oscillator comprising:
a light source;
a light modulator;
means for projecting light from said source onto said modulator;
a light demodulator;
means for projecting modulated light from said modulator onto said demodulator;
a feedback path for coupling wave energy from the output of said demodulator to said modulator for modulating said light;
said feedback path including frequency selective means;
and means for coupling wave energy at the frequency of said frequency selective means out of said oscillator.

2. The oscillator according to claim 1 wherein:
said modulator is a junction diode.

3. The oscillator according to claim 1 wherein:
said demodulator is a junction photodiode.

4. An oscillator comprising:
first and second sections of rectangular waveguide;
means for forming a first resonant cavity tuned to a given frequency within one end of said first section of waveguide;
a junction diode modulator disposed within said first cavity;
a source of linearly polarized light;
means for projecting light derived from said source upon the junction region of said diode with the direction of polarization of said light inclined at 45 degrees to the junction plane of said diode;
means for forming a second resonant cavity tuned to said given frequency within one end of said second section of waveguide;
a photodiode demodulator disposed within said second cavity;
an analyzer located between said cavities;
means for projecting light derived from said modulator through said analyzer and onto said demodulator;
means for coupling wave energy at said given frequency between said second cavity and said first cavity;
and means for extracting wave energy at said given frequency from said oscillator.

5. A traveling wave modulator comprising:
a plurality of spatially distributed junction diodes;

means for projecting a beam of optical wave energy through said diodes in a direction along said junctions, said wave energy propagating therealong at a given velocity;
and means for coupling a propagating modulating signal to said diodes where the velocity of propagation of said signal in the direction of said optical beam is substantially equal to said given velocity.

6. The method of amplifying electromagnetic wave signals comprising the steps of:
directing a light beam upon a light modulator;
applying the signal to be amplified to said modulator;
directing the amplitude modulated light beam produced in said modulator directly upon a light demodulator;
extracting the amplified signal from said demodulator.

7. An amplifier comprising, in combination:
a junction diode laser;
an electro-optical junction diode modulator;
an analyzer;
and a photodiode;
said diodes arranged such that the light emitted by said laser is directed upon said modulator;
means for coupling a modulating signal to be amplified to said modulator;
the modulated output from said modulator being directed upon said photodiode;
and means for extracting an amplified signal from said photodiode.

8. In combination, a laser for producing an optical wave of a prescribed frequency;
a modulator supplied with said optical wave for impressing thereon a signal wave;
a demodulator which is in proximate relationship with the modulator and to which is applied directly the modulated signal wave for extracting therefrom the signal wave;
the product of the modulator efficiency and the demodulator efficiency being greater than unity whereby the intensity of the extracted signal wave is larger than the intensity of the impressed signal wave.

References Cited

UNITED STATES PATENTS

| | | | |
|---|---|---|---|
| 2,776,367 | 1/1957 | Lehovec | 250—199 |
| 2,929,922 | 3/1960 | Schawlow et al. | 330—4.3 |
| 3,301,625 | 1/1967 | Ashkin et al. | 332—7.51 |

ROY LAKE, *Primary Examiner.*

D. R. HOSTETTER, *Assistant Examiner.*